United States Patent
Dhindsa et al.

(10) Patent No.: US 8,652,298 B2
(45) Date of Patent: Feb. 18, 2014

(54) TRIODE REACTOR DESIGN WITH MULTIPLE RADIOFREQUENCY POWERS

(75) Inventors: Rajinder Dhindsa, San Jose, CA (US); Alexei Marakhtanov, Albany, CA (US); Gerardo Delgadino, Santa Clara, CA (US); Eric Hudson, Berkeley, CA (US); Bi Ming Yen, Fremont, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 128 days.

(21) Appl. No.: 13/301,725

(22) Filed: Nov. 21, 2011

(65) Prior Publication Data
US 2013/0126475 A1   May 23, 2013

(51) Int. Cl.
*C23F 1/00* (2006.01)

(52) U.S. Cl.
USPC ............ 156/345.45; 156/345.47; 156/345.48; 438/714

(58) Field of Classification Search
USPC ........ 156/345.44, 45, 48, 49, 345.45, 345.47, 156/345.48, 345.49; 118/723 E, 723 I; 438/706, 714
See application file for complete search history.

(56) References Cited

U.S. PATENT DOCUMENTS

| | | | |
|---|---|---|---|
| 6,838,127 B2* | 1/2005 | Yun ............................. | 427/573 |
| 7,264,688 B1* | 9/2007 | Paterson et al. .......... | 156/345.34 |
| 7,749,353 B2* | 7/2010 | Rusu et al. ............... | 156/345.47 |
| 2006/0065369 A1 | 3/2006 | Dhindsa et al. | |
| 2007/0012659 A1* | 1/2007 | Rusu et al. ..................... | 216/58 |
| 2007/0221331 A1 | 9/2007 | Lee | |
| 2008/0119049 A1 | 5/2008 | Sung et al. | |

OTHER PUBLICATIONS

ISA/US, "International Search Report and Written Opinion" for PCT/US2012/063106, mailed Jan. 8, 2013.

* cited by examiner

*Primary Examiner* — Lan Vinh
(74) *Attorney, Agent, or Firm* — Martine Penilla Group, LLP

(57) ABSTRACT

Methods, systems, and computer programs are presented for semiconductor manufacturing are provided. One wafer processing apparatus includes: a top electrode; a bottom electrode; a first radio frequency (RF) power source; a second RF power source; a third RF power source; a fourth RF power source; and a switch. The first, second, and third power sources are coupled to the bottom electrode. Further, the switch is operable to be in one of a first position or a second position, where the first position causes the top electrode to be connected to ground, and the second position causes the top electrode to be connected to the fourth RF power source.

20 Claims, 8 Drawing Sheets

TRIODE REACTOR DESIGN WITH MULTIPLE RADIOFREQUENCY POWERS

BACKGROUND

1. Field of the Invention

The present embodiments relate to wafer processing apparatus, and more particularly, apparatus, methods, and computer programs for processing a wafer in a wafer processing apparatus.

2. Description of the Related Art

The manufacturing of integrated circuits includes immersing silicon substrates (wafers) containing regions of doped silicon into chemically-reactive plasmas, where the submicron device features (e.g., transistors, capacitors, etc.) are etched onto the surface. Once the first layer is manufactured, several insulating (dielectric) layers are built on top of the first layer, where holes, also referred to as vias, and trenches are etched into the material for placement of the conducting interconnectors.

Current plasma processing systems used in semiconductor wafer fabrication rely on highly interdependent control parameters to control radical separation, radical flux, ion energy, and ion flux delivered to the wafer. For example, current plasma processing systems attempt to achieve necessary radical separation, radical flux, ion energy, and ion flux by controlling a single plasma generated in the presence of the wafer. Unfortunately, chemistry dissociation and radical formation are coupled to ion production and plasma density and often do not work in concert to achieve the desired plasma processing conditions.

Some semiconductor processing equipment may be used in a wide range of applications. However the requirements for each of the applications may vary substantially, and it may be difficult to accommodate all the applications in the same processing equipment without adequate controls to configure the wafer processing process (e.g., to control the plasma chemistry in the chamber). A lack of control on the ion energy in the chamber limits the control of the desired process chemistry. If controls are not adequate, non-uniform deposition may result with non-uniform etching on the wafer.

It is in this context that embodiments arise.

SUMMARY

Embodiments of the disclosure provide apparatus, methods and computer programs for processing a wafer in a wafer processing apparatus. It should be appreciated that the present embodiments can be implemented in numerous ways, such as a process, an apparatus, a system, a device, or a method on a computer readable medium. Several embodiments are described below.

In one embodiment, a wafer processing apparatus includes: a top electrode; a bottom electrode; a first radio frequency (RF) power source; a second RF power source; a third RF power source; a fourth RF power source; and a switch. The first, second, and third power sources are coupled to the bottom electrode. Further, the switch is operable to be in one of a first position or a second position, where the first position causes the top electrode to be connected to a first voltage, and the second position causes the top electrode to be connected to the fourth RF power source. In one embodiment, the first voltage is electrical ground.

In another embodiment, a wafer processing apparatus includes: a top electrode and a bottom electrode inside a processing chamber; a first radio frequency (RF) power; a second RF power; a third RF power; a switch; a fourth RF power; and a system controller. The first, second, and third powers are coupled to the bottom electrode, and the switch is coupled to the top electrode and to the fourth RF power. The system controller is operable to set each of the first, second, and third RF powers to be one of turned on or turned off independently during a wafer processing operation, and the system controller is operable to set the switch to one of a first position or a second position. The first position causes the top electrode to be connected to electrical ground, and the second position causes the top electrode to be connected to the fourth RF power.

In yet another embodiment, a method, for processing a wafer in a wafer processing apparatus including a top electrode and a bottom electrode inside a processing chamber, includes an operation for receiving a recipe for processing the wafer. In addition, the method includes an operation for selecting whether to turn on or turn off each of a first radio frequency (RF) power, a second RF power, and a third RF power based on the recipe. The first, second, and third power sources are coupled to the bottom electrode. The position of a switch is set based on the recipe, where the top electrode is coupled to electrical ground when the switch is in a first position, and where the top electrode is coupled to a fourth RF power when the switch is in a second position. Once the chamber is configured according to the recipe, the wafer is processed, where at least one operation of the method is executed through a processor.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe apparatus, methods and computer programs for processing a wafer in a wafer processing apparatus. Embodiments of the disclosure use up to four different RF powers in a triode reactor configuration. It will be apparent, that the present embodiments may be practiced without some or all of these specific details. In other instances, well known process operations have not been described in detail in order not to unnecessarily obscure the present embodiments.

Figure 1:
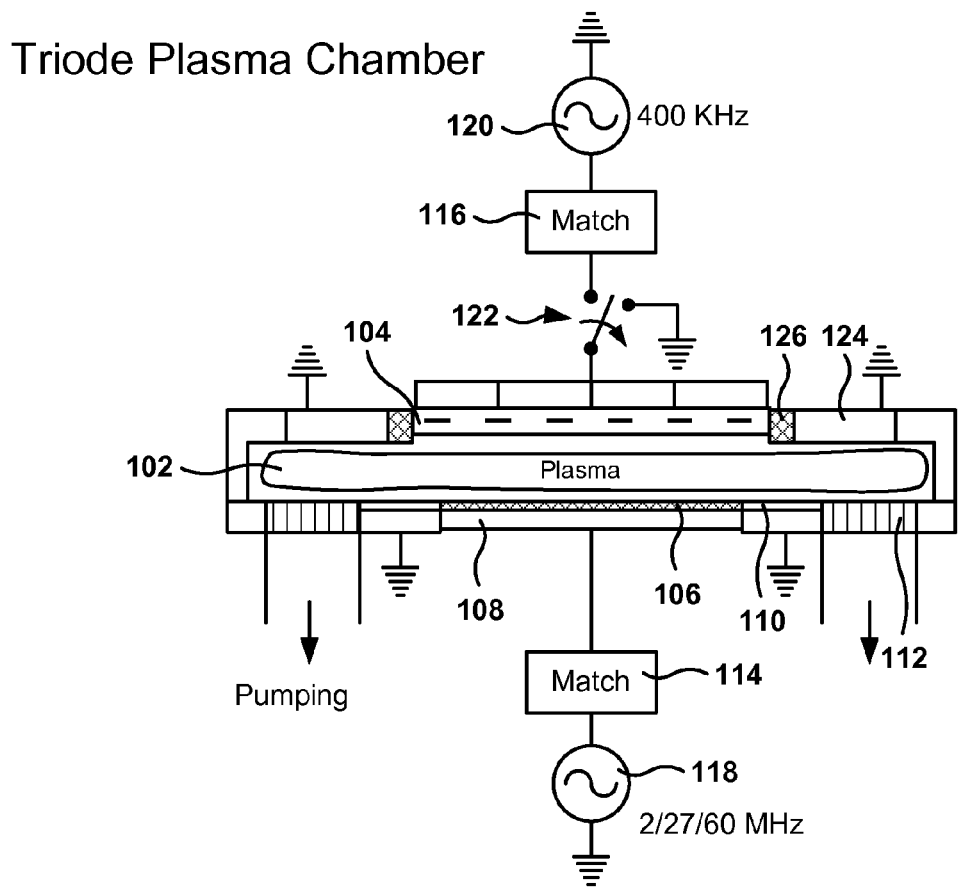
FIG. 1 shows an etching chamber, according to one embodiment.

FIG. 1 shows an etching chamber, according to one embodiment. Exciting an electric field between two electrodes is one of the methods to obtain RF gas discharge in an etching chamber. When an oscillating voltage is applied between the electrodes, the discharge obtained is referred to as a capacitive coupled plasma (CCP) discharge.

Plasma can be created utilizing stable feedstock gases to obtain a wide variety of chemically reactive by-products created by the dissociation of the various molecules caused by electron-neutral collisions. The chemical aspect of etching involves the reaction of the neutral gas molecules and their dissociated by-products with the molecules of the to-be-etched surface, and producing volatile molecules, which can be pumped away. When plasma is created, the positive ions are accelerated from the plasma across a space-charge sheath separating the plasma from the walls, to strike the wafer surface with enough energy to remove material from the surface of the wafer. This is known as ion bombardment or ion sputtering. Some industrial plasmas, however, do not produce ions with enough energy to efficiently etch a surface by purely physical means.

In one embodiment, Fluorocarbon gases, such as $CF_4$ and $C-C_4F_8$, are used in the dielectric etch process for their anisotropic and selective etching capabilities, but the principles described herein can be applied to other plasma-creating gases. The Fluorocarbon gases are readily dissociated into smaller molecular and atomic radicals. These chemically reactive by-products etch away the dielectric material, which in one embodiment can be $SiO_2$ or SiOCH for low-k devices.

The chamber of FIG. 1 illustrates a processing chamber with a top electrode 104 and a bottom electrode 108. Top electrode 104 may be grounded or coupled to RF generator 120, and the bottom electrode 108 is coupled to RF generator 118 via matching network 114. RF generator 118 provides RF power in 1, 2, or 3 RF frequencies. According to the configuration of the chamber for a particular operation, either one of the first, second, or third RF frequencies may be turned on or off. In the embodiment shown in FIG. 1, RF generator 118 provides 2 MHz, 27 MHz, and 60 MHz frequencies, but other frequencies are also possible.

The chamber of FIG. 1 includes a gas showerhead on the top electrode 104 to input gas in the chamber, and a perforated confinement ring 112 that allows the gas to be pumped out of the chamber. When substrate 106 is present in the chamber, silicon focus ring 110 is situated next to the substrate such that there is a uniform RF field at the bottom surface of the plasma 102 for uniform etching on the surface of the wafer.

Upper electrode 104 may be coupled to ground or coupled to RF power source 120. Switch 122 is operable to connect the top electrode 104 to ground when the switch is in a first position, or to RF power source 120 when the switch is in a second position. Matching network 116 is used to couple top RF power source 120 to the top electrode when the switch 122 is in the second position.

The embodiment of FIG. 1 shows a triode reactor configuration where the top electrode is surrounded by a symmetric RF ground electrode 124. Insulator 126 is a dielectric that isolates ground electrode 124 from top electrode 104. In one embodiment, RF power source 120 has a frequency of 400 kHz, but other frequencies are also possible. The low frequency RF power on the top electrode controls the ion energy on the top chamber as well as on the reactor walls. This provides another control of the plasma chemistry in the chamber, enabling operation-by-operation adjustment of the power setting in the recipes for wafer processing.

Each frequency is selected for a specific purpose in the wafer manufacturing process. In the example of FIG. 1, with RF powers of 2 MHz, 27 MHz, and 60 MHz, the 2 MHz RF power provides ion energy control, and the 27 MHz and 60 MHz power provide control of the plasma density and the dissociation patterns of the chemistry. This configuration, where each RF power may be turned on or off, enables certain processes that use ultra-low ion energy on the wafers, and certain processes (e.g., soft etch for low-k materials) where the ion energy has to be low (under 100 or 200 eV).

In another embodiment, a 60 MHz RF power is used on the top electrode to get ultra-low energies and very high density. This configuration allows chamber cleaning with high density plasma when the wafer is not in the chamber, while minimizing sputtering on the ESC (electro static chuck) surface. The ESC surface is exposed when the wafer is not present, and any ion energy on the surface must be avoided, which is why the bottom 2 MHz and 20 MHz power supplies are off during cleaning.

The chamber with four RF powers provides hardware controls for the plasma chemistries, as well as for the plasma density and uniformity. For example, the radial uniformity may be controlled with the independent RF source at the top.

Figure 2:
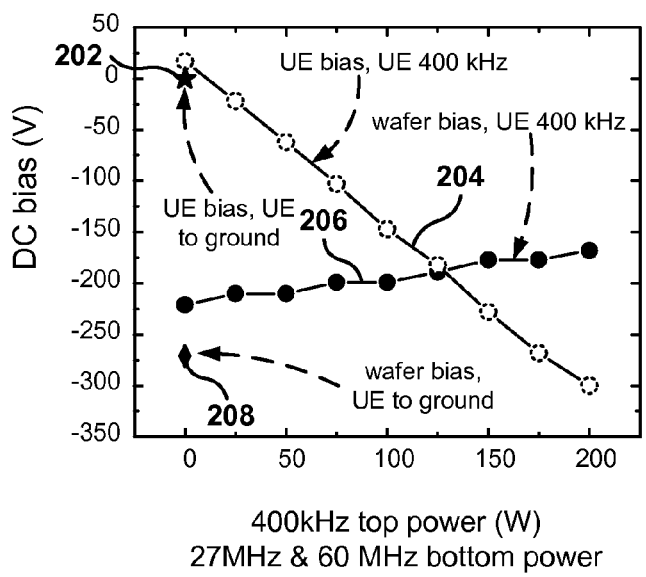
FIG. 2 is a chart illustrating the changes in the DC bias as a function of the power applied to the top electrode, according to one embodiment.

FIG. 2 is a chart illustrating the changes in the DC bias as a function of the power applied to the top electrode, according to one embodiment. The measurements shown in FIG. 2 are taken with RF power of 27 MHz and 60 MHz on the bottom electrode. When the top electrode is coupled to ground (i.e., the top RF power source is not coupled to the top electrode), the upper electrode has a DC bias 202 of 0V, and the wafer has a DC bias 208 of around −275V.

When the top electrode is coupled to an RF power source of 400 kHz, the DC bias in the upper electrode (UE) 204 decreases as the power supplied by the RF power source increases. For example, when the upper electrode has a power of around 100 W the DC bias is around −150 V, and when the power is 200 W the DC bias on the upper electrode is around −300 volts.

There are several effects resulting from increasing the power on the top electrode. First, as the power increases the sheath potential on the upper electrode also increases. Second, as the power increases on the upper electrode so does the plasma density. This means that the chemistry of the process changes as the RF power on the top electrode increases. However, the potential at the wafer remains substantially constant, while the bias on the upper electrode changes significantly. There is an increase in the ion bombardment at the upper electrode, which causes a change in the chemistry. Controlling ion bombardment with a low frequency is an effective way to control the surface chemistry, that in turn affects the bulk chemistry and helps in the optimization wafer processing.

Figure 3:
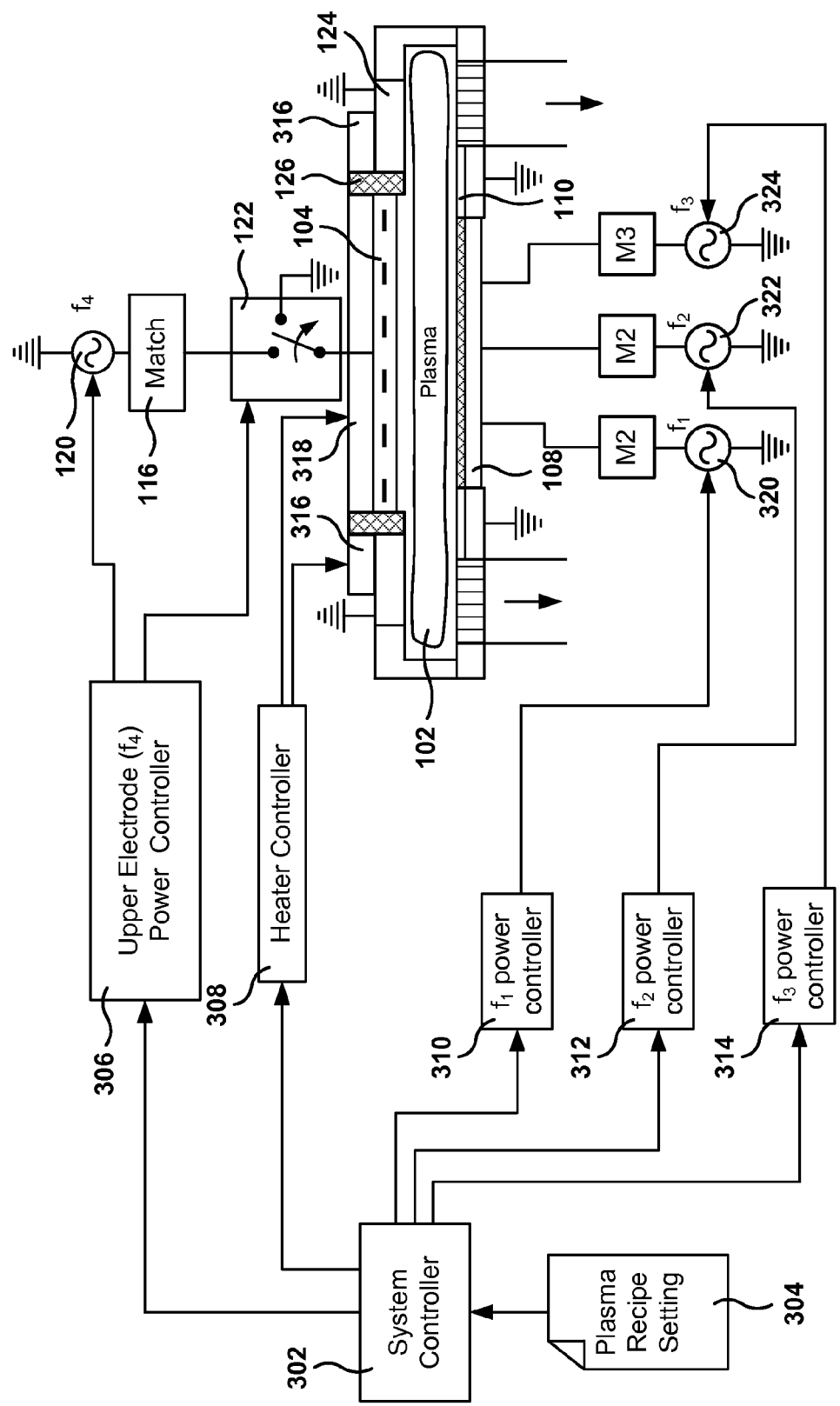
FIG. 3 shows a semiconductor wafer processing apparatus, in accordance with one embodiment.

FIG. 3 shows a semiconductor wafer processing apparatus, in accordance with one embodiment. The chamber of FIG. 3 includes RF power sources 320, 322, and 324 with RF frequencies $f_1$, $f_2$, $f_3$, respectively, which are connected to the bottom electrode 108 via the corresponding matching networks. The top electrode 104 is connected to a fourth RF power source 120, having an RF frequency $f_4$, via switch 122 and matching network 116.

Further, the chamber includes a switch 122 that connects the top electrode 104 to either ground or to RF power source 120 via matching network 116. A first heater 318 is situated above the top electrode 104, and a second heater 316 is situated above ground electrode 124. The heaters are isolated from the top electrode and the ground electrode by a layer of aluminum nitrate material, although other insulators may also be utilized. Heater 316 controls the temperature in the outer area of the ground electrode, and heater 318 controls the temperature of the upper electrode. Each heater is operable to be turned on or turned off independently during a wafer processing operation.

Controlling the temperature of the upper electrode may be utilized to adjust the response of the chamber. However, controlling the temperature has the limitation that the temperature cannot be changed quickly. Therefore, temperature control provides a slow response to changes in the chamber. It is difficult to control each wafer-processing operation utilizing temperature control of the top electrode. In addition, there is an upper limit to the temperature that can be applied to the silicon surfaces in the chamber.

The wafer processing apparatus further includes system controller 302, upper electrode power controller 306, heater controller 308, and power controllers 310, 312, and 314 for $f_1$, $f_2$, and $f_3$, respectively. System controller 302 receives a plasma recipe 304, which includes instructions for the different operations performed on the chamber. Processing of the wafer may be done in multiple operations, and each operation may require different settings in the chamber. For example, in one operation all four RF power sources are turned on, while in other operations only 3, or 2, or 1 RF power sources are turned on, etc.

Based on the recipe 304, the system controller sets the operational parameters of the chamber, including which RF power sources are turned on or turned off, their voltages and power settings, the setting of switch 122, the settings for heaters degrees 316 and 318, the gasses used in the chamber, the pressure on the chamber, the duration of the wafer-processing operation, etc. In one embodiment, the system controller 302 sends instructions to upper electrode power controller 306 for the configuration of the power on the top electrode, which includes setting switch 122 to connect the top electrode to ground or to RF power, and turning on or off RF power 120, as well as setting the power level for RF power 120.

System controller 302 interfaces with heater controller 308 to regulate the temperature of the upper electrode 104. Heater controller 308 regulates heaters 316 and 318 to control the temperature of the top electrode. A temperature sensor (not shown) provides information to heater controller 308 on the temperature of the upper electrode in one or more points of the upper electrode. Therefore, heater controller 308 may regulate the temperature on the upper electrode by turning on or off the heaters to achieve a desired temperature during wafer processing.

System controller also 302 interfaces with power controllers 310, 312, and 314, which regulate whether the corresponding RF power 310, 322, or 324, is turned on or off, and if the power is turned on, to what power setting. In one embodiment, the frequency of RF power source 120 is 400 kHz. In another embodiment, the frequency is in the range from 400 kHz to 2 MHz, while in yet another embodiment the frequency is in the range from 100 kHz to 10 MHz. In some operations, the three bottom RF powers are not turned on simultaneously, which allows having a higher frequency at the top RF. In one embodiment, $f_4$ is different from the frequencies at the bottom $f_1$-$f_3$ in order to avoid resonance on the chamber.

In one embodiment, the pressure in the chamber has a value between 20 mTorr and 60 mTorr. In another embodiment, the voltage of the top power source can be in the range of hundreds of volts (e.g., 100 V to 2000 V or more), and the bottom RF power sources can have a voltage up to 6000 V or more. In one embodiment, the voltage is 1000 V. In another embodiment, the voltage of the top RF power source has a value between 100 V and 600 V, and the voltage of the bottom RF power sources has a value between 1000 V and 6000V. The pressure in the top chamber and the bottom chamber can have a value between 10 mTorr and 500 mTorr. In one embodiment, the chamber operates at a pressure of 15 mTorr.

It is noted that the embodiment illustrated in FIG. 3 is exemplary. Other embodiments may utilize different types of chambers, different frequencies, other types of adjustments for the chamber configuration based on the recipe, different pressures in the chamber, etc. For example, in one embodiment, the chamber is a CCP plasma chamber. Furthermore, some of the modules described above in the semiconductor wafer processing apparatus may be combined into a single module, or the functionality of a single module may be performed by a plurality of modules. For example, in one embodiment, power controllers 310, 312, and 314 are integrated within system controller 302, although other configurations are also possible. The embodiment illustrated in FIG. 3 should therefore not be interpreted to be exclusive or limiting, but rather exemplary or illustrative.

Figure 4B:
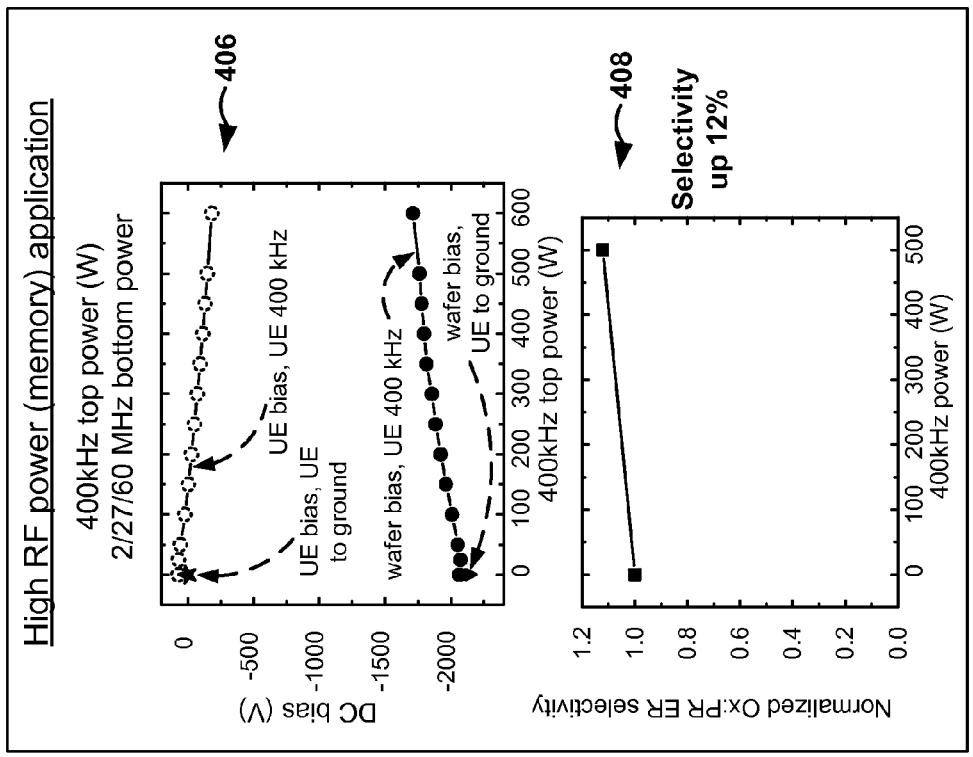
FIGS. 4A and 4B illustrate the behavior of the wafer processing apparatus as a function of the power applied to the top electrode, according to one embodiment.
Figure 4A:
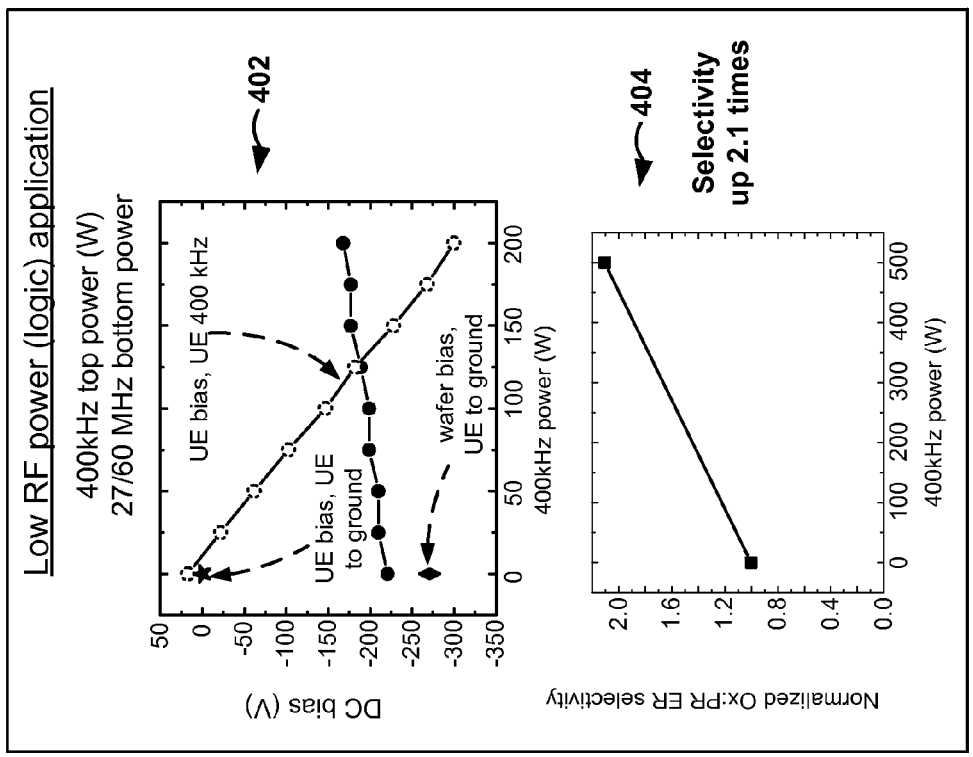

FIGS. 4A and 4B illustrate the behavior of the wafer processing apparatus as a function of the power applied to the top electrode, according to one embodiment. FIG. 4A illustrates the behavior of the chamber based on the power applied to the top electrode in a low RF power application (i.e. logic application). The chamber of FIG. 4A was operated with a pressure of 60 mTorr, a 27 MHz RF power with 160 W applied to the bottom electrode, a 60 MHz RF power with 160 W applied to the bottom electrode, a 400 kHz RF power applied to the top electrode, and a combination of gases that includes $C_4F_8$, $O_2$, $CF_4$, $N_2$, and Ar.

Chart 402 illustrates that when the upper electrode (UE) is connected to ground, the DC bias of the upper electrode is 0V, and the wafer bias is about −275 V. If the upper electrode is connected to the 400 kHz RF power, the bias of the upper electrode decreases as the power on the top electrode increases. For example, when the power of the top RF is 200 W, the bias of the upper electrode is about −300V. The bias of the upper electrode has gone from 0 V when no RF power is applied to the upper electrode, to −300V when the RF power on the upper electrode is at 200 W.

The bias of the wafer also changes with the power applied to the top electrode, although not as rapidly as the bias of the top electrode. The bias of the wafer goes from about −250 V when no power is applied to the top electrode, to about −175 V when 200 W are applied to the top electrode.

Chart 404 illustrates how the selectivity of etching between mask and feature (oxide to PR) increases as power to the upper electrode increases. More details about measuring selectivity are provided below with reference FIG. 6. It is noted that the scale of the x axis is different in charts 402 at 404.

Chart 404 shows normalized values of the selectivity, which means that the improvement in selectivity is based on a reference selectivity measure when no RF power is applied to the top. For example, the selectivity may have a value of 5 when no power is applied to the top electrode, and the normalized selectivity value is equal to the selectivity value divided by 5. In chart 404, the normalized selectivity goes from 1 when no power is applied on the top, to a normalized selectivity value of 2.1 when 500 W are applied at the top. This means that the selectivity has improved by 210 percent when 500 W are applied at the top.

FIG. 4B illustrates the behavior of the chamber based on the power applied to the top electrode in a high RF power application (i.e. memory application). Typically, a memory application requires high density and several different layers. The logic may have 10 to 15 different operations, and each operation must be controlled precisely. Generally, the logic applications are low-power applications and selectivity in each layer is very important.

The chamber of FIG. 4B was operated with a pressure of 15 mTorr, a 2 MHz RF power with 5000 W applied to the bottom electrode, a 27 MHz RF power with 1000 W applied to the bottom electrode, a 60 MHz RF power with 200 W applied to the bottom electrode, a 400 kHz RF power applied to the top electrode, and a combination of gases including Ar, $C_4F_8$, and $O_2$, which show high efficiency at producing very high plasma density.

Since the memory application requires high-power, the y axis scale of chart 406 is different from the scale of chart 402. As more power is applied to the top electrode, the bias on the upper electrode decreases and the bias of the wafer increases. The selectivity improvement, shown in chart 408, is less than the selectivity improvement for the low-power application, but still shows a 12 percent improvement in selectivity. The selectivity improvement is not as big due to the type of materials utilized in memory applications.

Figure 5A:
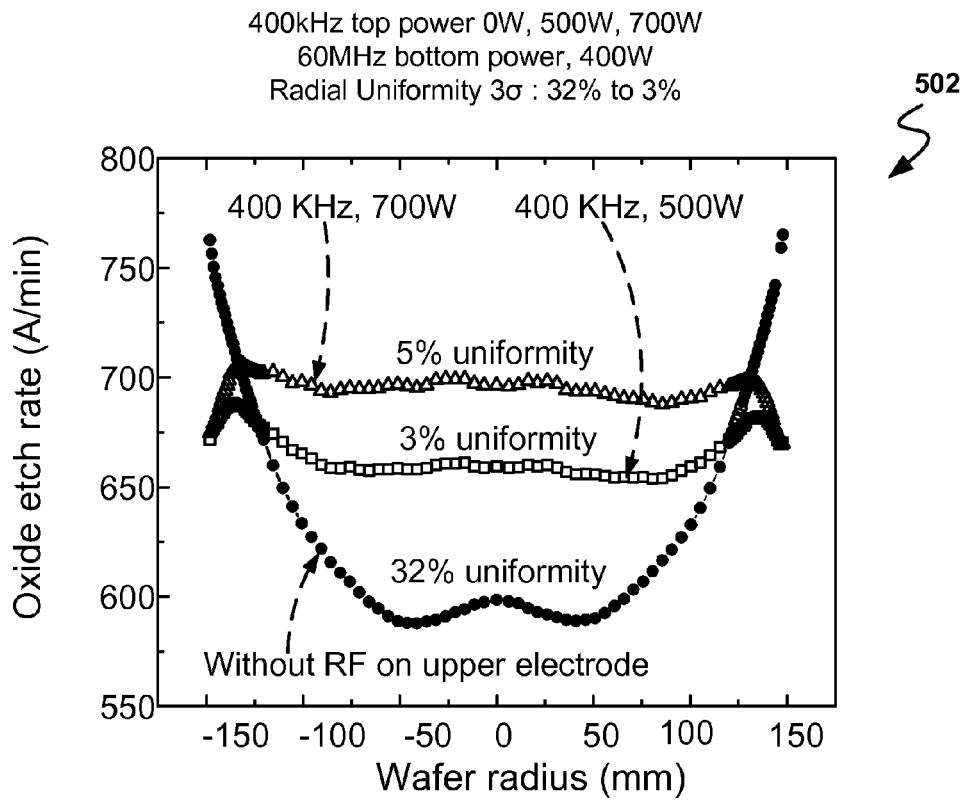
FIG. 5A shows measurements of etching uniformity under several working conditions, according to one embodiment.

FIG. 5A shows measurements of etching uniformity under several working conditions, according to one embodiment. In one embodiment, wafer uniformity is defined as the coefficient of variation of the observations on the wafer, namely three times the standard deviation expressed as a percentage of the mean, with a 3 millimeter edge exclusion. Therefore, a uniformity value of 0 would correspond to the ideal uniformity.

Measurements of uniformity were made in a chamber configured with a pressure of 30 mTorr, a 60 MHz RF power with 400 W applied to the bottom electrode, a 400 kHz RF power applied to the top electrode, and a combination of gases which includes, $CF_4$, $CHF_3$, and $O_2$. Measurements were made when the top RF had 0 W (i.e., no RF on top electrode), 500 W, and 700 W.

It is noted that applying power to the top electrode is one way to improve the uniformity, but there are other ways to improve uniformity. The measurements made in FIG. 5A were made to compare behaviors with different powers applied to the top electrode, but other uniformity measurements were not applied. Therefore, uniformity may be better when other mechanisms to improve uniformity are applied together with power on the top electrode.

Chart 502 illustrates how uniformity improves when power is applied to the top electrode. However, if too much power is applied, the uniformity improvement may be less than when the right amount of power is applied to the top electrode. When RF power was not applied to the top electrode the uniformity measurement was 32 percent. However, when 500 W of 400 kHz where applied to the top, the uniformity was 3 percent, and when 700 W 400 kHz where applied the uniformity was 5 percent. It should be noted that different etching operations may produce different results, and that uniformity may be more or less critical depending on the wafer processing operation.

Figure 5B:
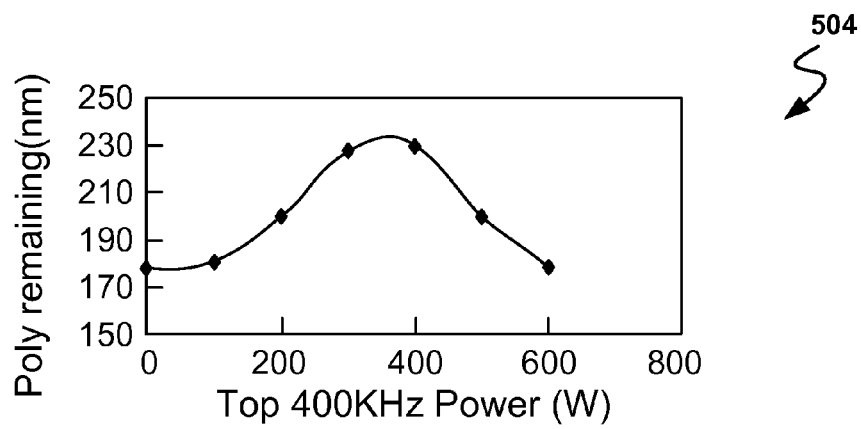
FIG. 5B illustrates the amount of polysilicon remaining as a function of the power to the top electrode, according to one embodiment.

FIG. 5B illustrates the amount of polysilicon remaining as a function of the power to the top electrode, according to one embodiment. Chart 504 shows the amount of polysilicon remaining on the wafer is a function of the amount of power applied to the top electrode, using a frequency of 400 kHz. The chart shows that as the power increases, the polysilicon remaining on the wafer also increases, i.e., the selectivity improves. However, after reaching a maximum around 380 W, the improvement decreases as the amount of polysilicon remaining starts getting smaller as the power goes higher than 380 W. As the power is increased past the maximum on the curve, there is too much polymer deposition on the chamber to obtain further improvement.

Chart 504 shows that there is a maximum improvement which can be realized by applying power to the top electrode when etching using a polysilicon mask. Different chambers will have different values for the amount of power that is optimal, and each operation in the etching process may need to use a different amount of power on the top electrode. Additionally, other factors in the chamber may affect the amount of improvement that the top RF will provide.

Figure 6:
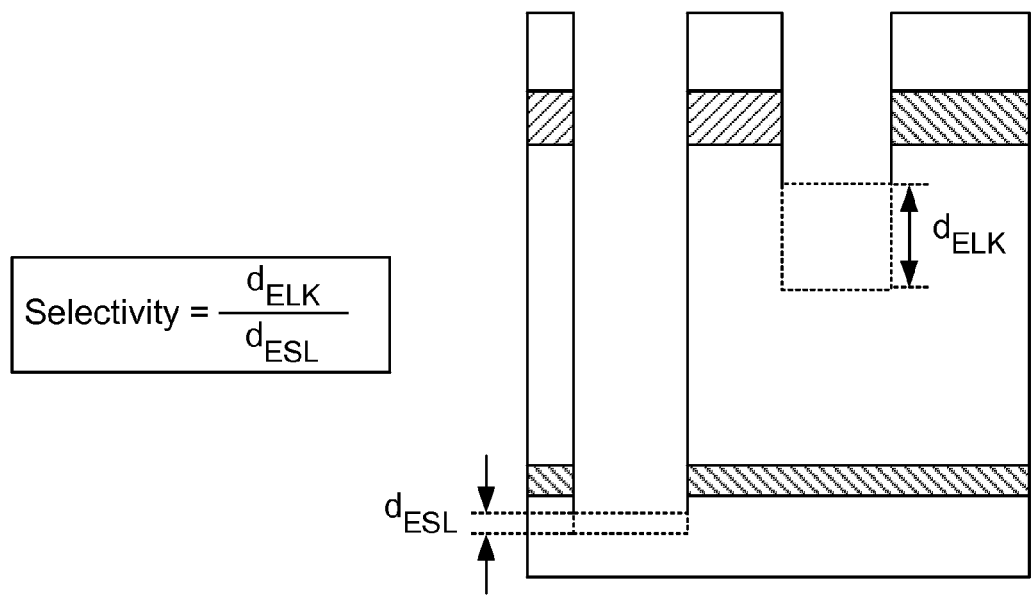
FIG. 6 shows a measurement of etching selectivity on the wafer, according to one embodiment.

FIG. 6 shows a measurement of etching selectivity on the wafer, according to one embodiment. Selectivity is defined as the ratio of etch rates in the two materials. In the embodiment of FIG. 6, the first material is a Extreme Low-K (ELK) material and the second material is an Etch Stop Layer (ESL). To obtain the selectivity value, the etch rate $d_{ELK}$ of the ELK material is divided by the etch rate $d_{ESL}$ of the ESL material, according to the following formula:

$$\text{Selectivity} = \frac{d_{ELK}}{d_{ESL}}$$

The goal is to have an ESL that does not etch as fast as the ELK, to obtain a selectivity value greater than 1, and the higher the selectivity value, the better. As discussed above, applying RF power to the top electrode will improve selectivity in some etching operations.

Figure 7:
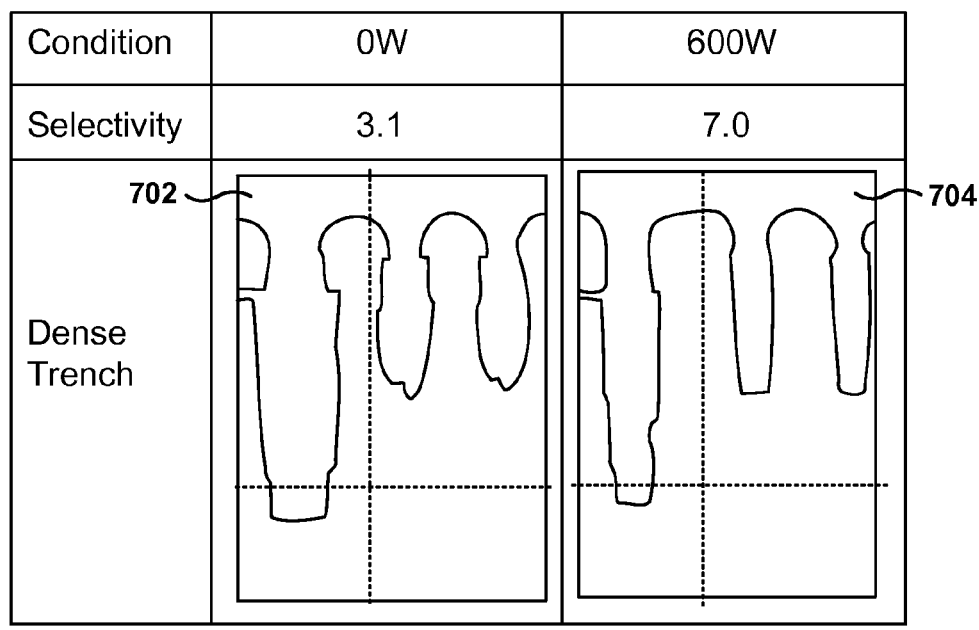
FIG. 7 shows sample results obtained with embodiments of the disclosure.

FIG. 7 shows sample results obtained with embodiments of the disclosure. Profile 702 represents an image taken of the processing of the wafer when no power is applied to the top electrode. The selectivity measurement was 3.1. Profile 702 represents the same image taken when 600 W of 400 kHz is applied to the top electrode. The selectivity when power is applied to the top electrode is 7.0, more than double the selectivity when no power is applied.

Figure 8:
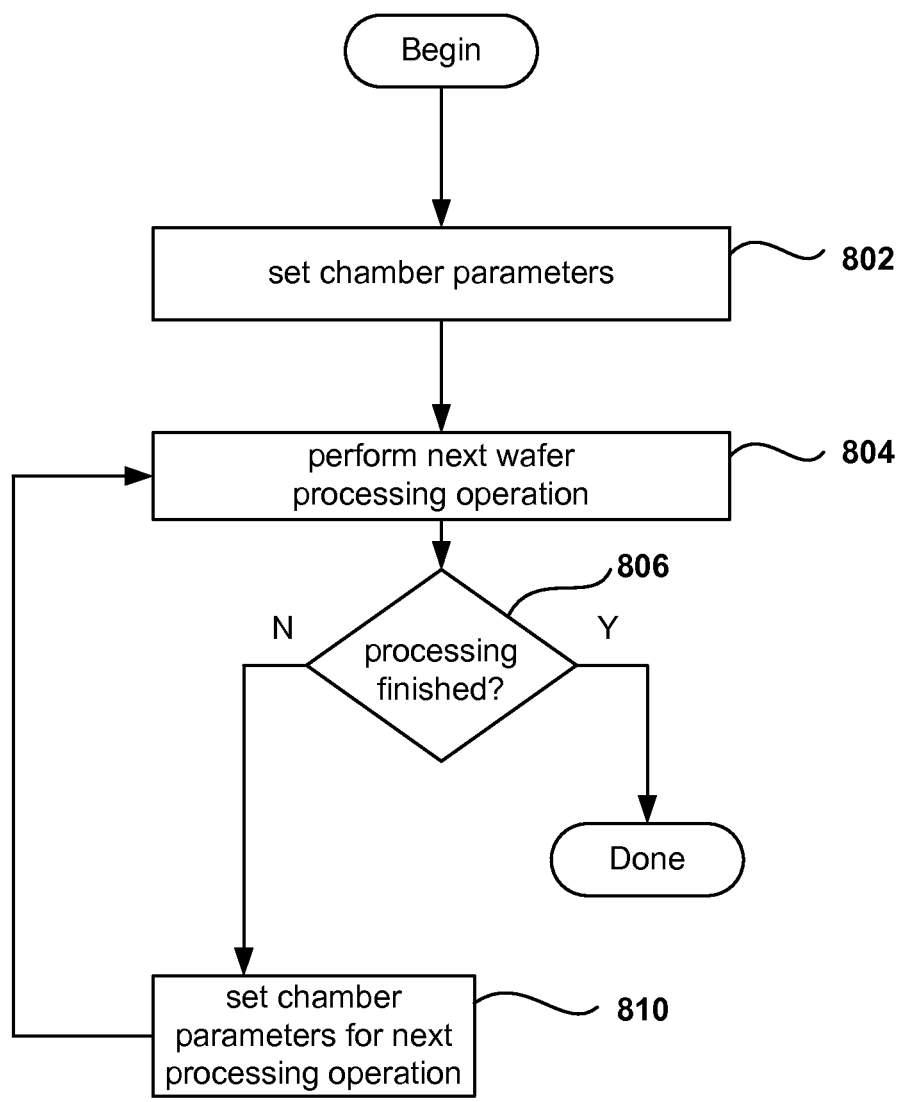
FIG. 8 shows the flow of an algorithm for processing a wafer in multiple operations, in accordance with one embodiment.

FIG. 8 shows the flow of an algorithm for processing a wafer in multiple operations, in accordance with one embodiment. As discussed above, a wafer goes through multiple etching operations, and each of the operations may require different chamber configurations. The recipe defines the parameters for the chamber at each operation. FIG. 8 illustrates a method for processing a wafer in multiple operations.

In operation 802, the parameters of the chamber are set for the upcoming etching operation based on the recipe. The parameters may include which RF powers to apply, with what power levels, the gases used in the chamber, the amount of time for the etching operation, etc. From operation 802, the method continues to operation 804 where the wafer is processed in the chamber.

In operation 806, the system controller determines if the wafer has to go through additional processing operations or not. If no more operations are required (i.e., processing of the wafer is finished), the processing of the wafer ends, at least for this processing stage, although the wafer may go through other processing stages. However, if additional processing operations are to be done on the wafer, the method flows to operation 810, where the chamber is configured according to the parameters defined in the recipe for the next wafer processing operation. From operation 810, the method flows to operation 804 to perform the next processing operation on the wafer.

It is noted that each processing operation may have different configurations of the chamber. Each processing operation may have each RF power turned on or turned off, or have each RF power applied with a different power level. Further, the top RF power may be applied in some operations, or may be disconnected in other operations (e.g., by setting the position of switch 122 of FIG. 3).

Figure 9:
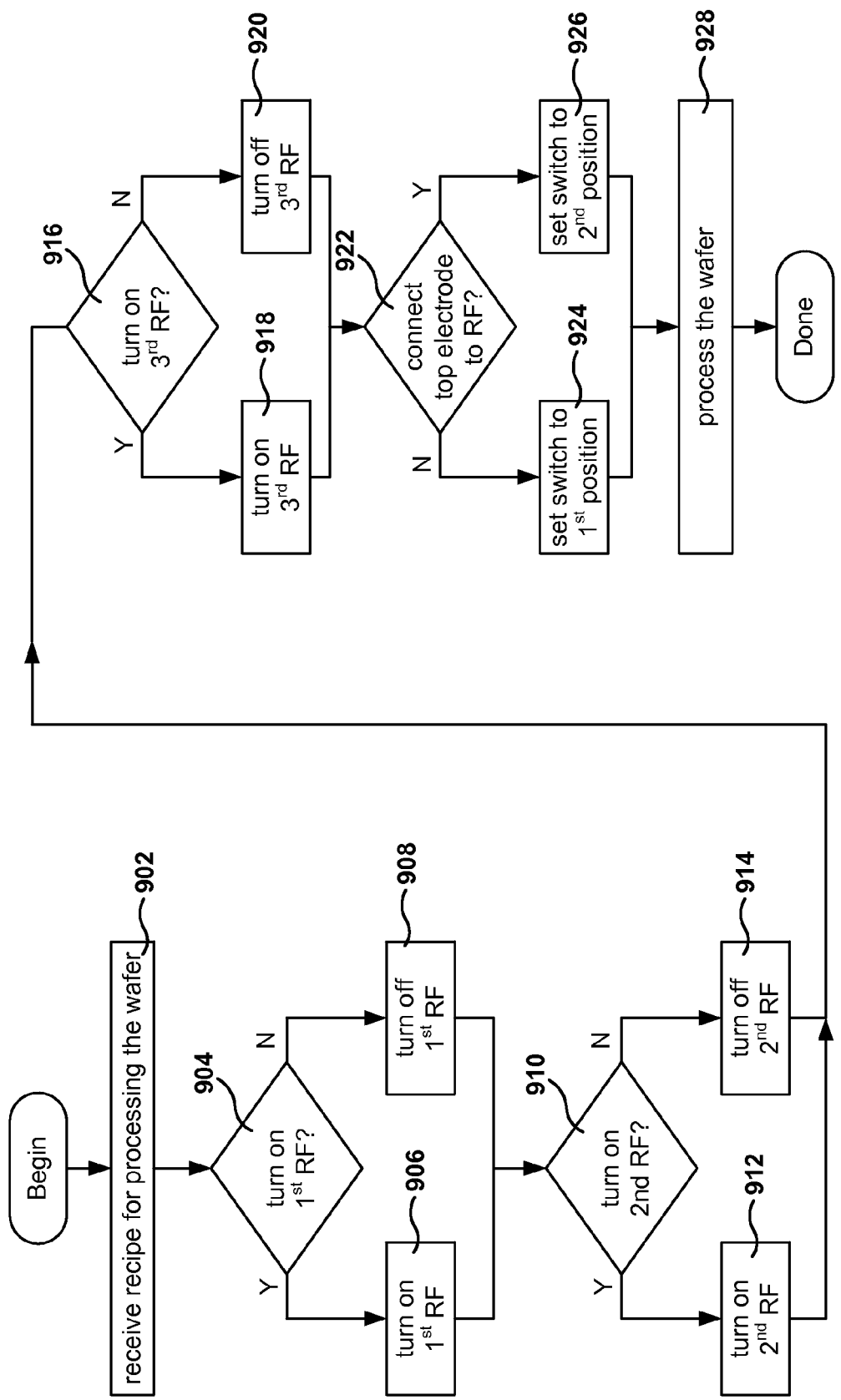
FIG. 9 shows the flow of an algorithm for processing a wafer in a wafer processing apparatus including a top electrode and a bottom electrode inside a processing chamber, in accordance with one embodiment.

FIG. 9 shows the flow of an algorithm for processing a wafer in a wafer processing apparatus including a top electrode and a bottom electrode inside a processing chamber (e.g. the chamber of FIG. 3), in accordance with one embodiment. In operation 902, a system controller receives a recipe with instructions or data regarding the processing of the wafer.

In operation 904, a determination is made whether to turn on or off the first RF power supply (e.g. RF power 320 in FIG. 3), which is coupled to the bottom electrode in the chamber. If the first RF power supply is to be turned on, the method flows to operation 906, where the first RF power supply is turned on. If the first RF power supply is not to be powered, the method continues to operation 908, where the first RF power supply is turned off.

In operation 910, a determination is made whether to turn on or off the second RF power supply (e.g. RF power 322 in FIG. 3), which is coupled to the bottom electrode in the chamber. If the second RF power supply is to be turned on, the method flows to operation 912, where the second RF power supply is turned on. If the second RF power supply is not to be powered, the method continues to operation 914, where the second RF power supply is turned off.

In operation 916, a determination is made whether to turn on or off the third RF power supply (e.g. RF power 324 in FIG. 3), which is coupled to the bottom electrode in the chamber. If the third RF power supply is to be turned on, the method flows to operation 918, where the third RF power supply is turned on. If the third RF power supply is not to be powered, the method continues to operation 920, where the third RF power supply is turned off.

In operation 922, a check is made to determine if the top electrode is to be coupled to the top RF power or to ground. If the top electrode is not to be connected to the RF power (i.e., the top electrode is to be grounded), the method continues to operation 924 where the switch (e.g., switch 122 of FIG. 3), which connects the top electrode to the top RF power or to ground, is set to a first position. When the switch is in the first position the top electrode is connected to electrical ground. In one embodiment, the power level of the fourth RF power is determined to maximize the amount of remaining polysilicon after the etching operation.

If the top electrode is to be connected to the RF power the method continues to operation 926 where the switch is set to a second position, which causes the coupling of the top RF power to the top electrode. From operation 924 or operation 926, the method continues in operation 928, where the wafer is processed after having configured the chamber according to the recipe.

Figure 10:
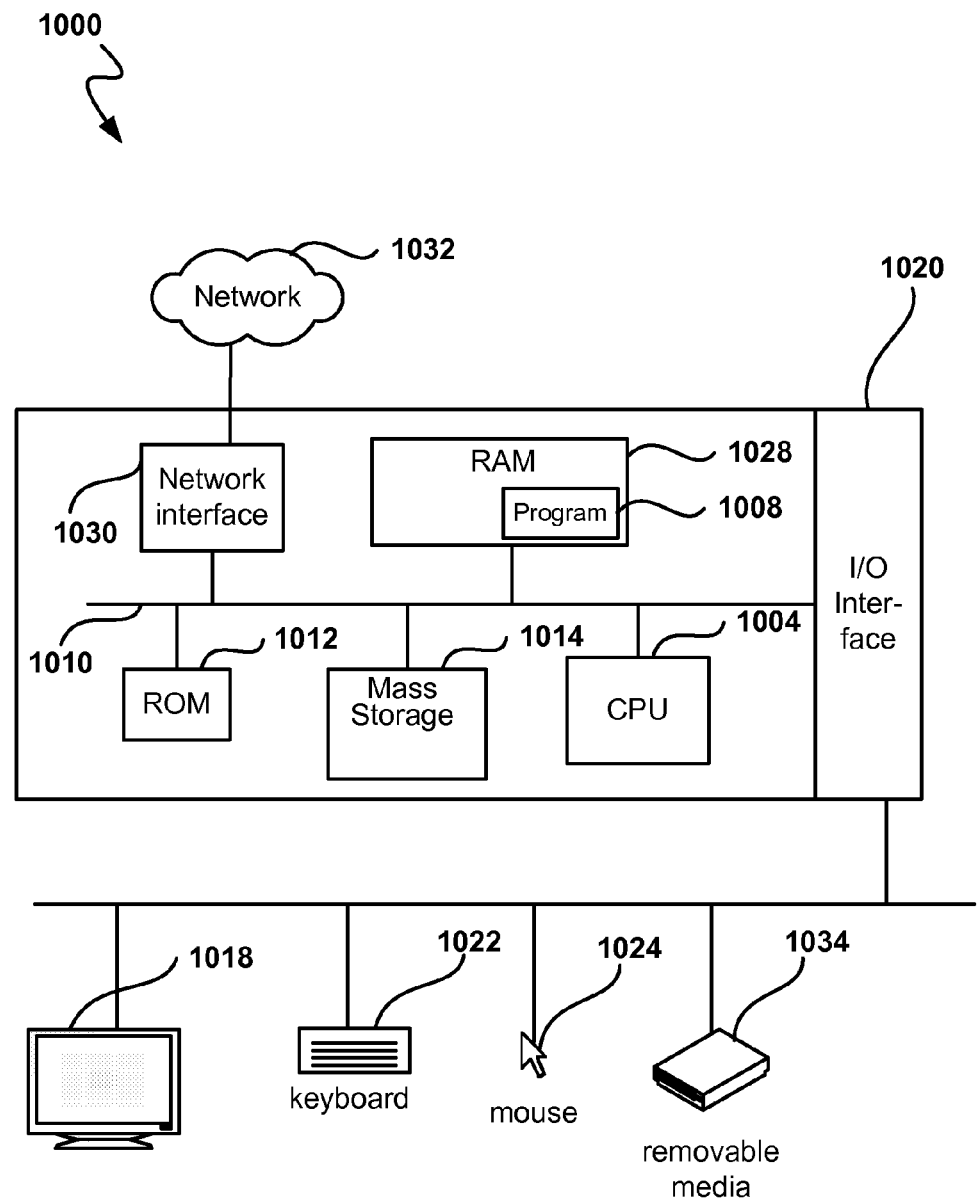
FIG. 10 is a simplified schematic diagram of a computer system for implementing embodiments described herein.

FIG. 10 is a simplified schematic diagram of a computer system for implementing embodiments described herein. It should be appreciated that the methods described herein may be performed with a digital processing system, such as a conventional, general-purpose computer system. Special purpose computers, which are designed or programmed to perform only one function, may be used in the alternative. The computer system includes a central processing unit (CPU) 1004, which is coupled through bus 1010 to random access memory (RAM) 1028, read-only memory (ROM) 1012, and mass storage device 1014. Phase control program 1008 resides in random access memory (RAM) 1028, but can also reside in mass storage 1014 or ROM 1012.

Mass storage device 1014 represents a persistent data storage device such as a floppy disc drive or a fixed disc drive, which may be local or remote. Network interface 1030 provides connections via network 1032, allowing communications with other devices. It should be appreciated that CPU 1004 may be embodied in a general-purpose processor, a special purpose processor, or a specially programmed logic device. Input/Output (I/O) interface provides communication with different peripherals and is connected with CPU 1004, RAM 1028, ROM 1012, and mass storage device 1014, through bus 1010. Sample peripherals include display 1018, keyboard 1022, cursor control 1024, removable media device 1034, etc.

Display 1018 is configured to display the user interfaces described herein. Keyboard 1022, cursor control 1024, removable media device 1034, and other peripherals are coupled to I/O interface 1020 in order to communicate information in command selections to CPU 1004. It should be appreciated that data to and from external devices may be communicated through I/O interface 1020. The embodiments can also be practiced in distributed computing environments where tasks are performed by remote processing devices that are linked through a wire-based or wireless network.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A wafer processing apparatus including a first top electrode and a bottom electrode inside a processing chamber, the wafer processing apparatus comprising:
a second top electrode coupled to electrical ground;
a first radio frequency (RF) power source, a second RF power source, and a third RF power source, the first, second, and third power sources being coupled to the bottom electrode;
a fourth RF power source with a low RF frequency in a range from 100 kHz to less than 2 MHz; and
a switch operable to be in one of a first position or a second position, the first position causing the first top electrode to be connected to a first voltage, and the second position causing the first top electrode to be connected to the fourth RF power source, wherein a power level of the fourth RF power source is defined for each wafer processing operation to control a chemistry in the processing chamber while keeping a potential at the wafer substantially constant.

2. The apparatus as recited in claim 1, wherein the first RF power source is operable to be one of enabled or disabled during each wafer processing operation in the processing chamber, wherein the second RF power source is operable to be one of enabled or disabled during each wafer processing operation in the processing chamber, and wherein the third RF power source is operable to be one of enabled or disabled during each wafer processing operation in the processing chamber.

3. The apparatus as recited in claim 1, wherein the first voltage is electrical ground.

4. The apparatus as recited in claim 1, further including:
a first heater coupled to the first top electrode, the first heater being operable to be one of turned on or turned off during a wafer processing operation.

5. The apparatus as recited in claim 4, further including:
a second heater coupled to the first top electrode, the second heater being operable to be one of turned on or turned off during the wafer processing operation.

6. The apparatus as recited in claim 5, further including:
a heater controller operable to set the first heater and the second heater to be one of turned on or turned off.

7. The apparatus as recited in claim 1, further including:
a first power controller operable to configure the first RF power source based on a recipe for processing the wafer.

8. The apparatus as recited in claim 1, wherein the wafer processing apparatus is configured according to a first configuration for a first application, the first configuration including:
the first RF power source being turned off;
the second RF power source being turned on with a frequency of 27 MHz;
the third RF power source being turned on with a frequency of 60 MHz; and
the fourth RF power source being turned on with a frequency of 400 kHz.

9. The apparatus as recited in claim 1, wherein the wafer processing apparatus is configured according to a second configuration for a second application, the second configuration including:
the first RF power source being turned on with a frequency of 2 MHz;
the second RF power source being turned on with a frequency of 27 MHz;
the third RF power source being turned on with a frequency of 60 MHz; and
the fourth RF power source being turned on with a frequency of 400 kHz.

10. The apparatus as recited in claim 1, wherein the fourth RF power source is operable to be turned off when the switch is in the first position, and operable to be turned on when the switch is in the second position.

11. A wafer processing apparatus including a first top electrode and a bottom electrode inside a processing chamber, the wafer processing apparatus comprising:
a second top electrode coupled to electrical ground;
a first radio frequency (RF) power, a second RF power, and a third RF power, wherein the first, second, and third RF powers are coupled to the bottom electrode;
a switch coupled to the first top electrode;
a fourth RF power coupled to the switch; and
a system controller, wherein the system controller is operable to set each of the first, second, and third RF powers to be one of turned on or turned off independently during a wafer processing operation, and wherein the system controller is operable to set the switch to one of a first position or a second position, the first position causing the first top electrode to be connected to electrical ground, and the second position causing the first top electrode to be connected to the fourth RF power with a low RF frequency in a range from 100 kHz to less than 2 MHz, wherein a power level of the fourth RF power is defined for each wafer processing operation to control a chemistry in the processing chamber while keeping a potential at the wafer substantially constant.

12. The apparatus as recited in claim 11, wherein the system controller is further operable to set power levels for the first, second, third, and fourth RF powers.

13. The apparatus as recited in claim 11, wherein a frequency of the first RF power is 2 MHz, wherein a frequency of the second RF power is 27 MHz, wherein a frequency of the third RF power is 60 MHz, and wherein a frequency of the fourth RF power is 400 kHz.

14. A method for processing a wafer in a wafer processing apparatus including a first top electrode and a bottom electrode inside a processing chamber, the method comprising:
receiving a recipe for processing the wafer;
selecting whether to turn on or turn off each of a first radio frequency (RF) power, a second RF power, and a third RF power based on the recipe, the first, second, and third RF powers being coupled to the bottom electrode;
coupling a second top electrode to electrical ground;

setting a position of a switch based on the recipe, wherein the first top electrode is coupled to electrical ground when the switch is in a first position, and wherein the first top electrode is coupled to a fourth RF power when the switch is in a second position, the fourth RF power having a low RF frequency in a range from 100 kHz to less than 2 MHz;

setting a power level for the fourth RF power to control a chemistry in the processing chamber while keeping a potential at the wafer substantially constant; and processing the wafer, wherein at least one operation of the method is executed through a processor.

15. The method as recited in claim 14, further including:
determining a next operation in the recipe for processing the wafer;
enabling or disabling each of the first RF power, second RF power, and third RF power based on the next operation; and
setting the position of the switch based on the next operation.

16. The method as recited in claim 14, further including:
setting power levels based on the recipe for the first, second, third, and fourth RF powers before processing the wafer.

17. The method as recited in claim 14, further including:
determining a power level of the fourth RF power to maximize remaining polysilicon.

18. The method as recited in claim 14, wherein the processing chamber has a pressure between 5 mTor and 30 mTor during processing of the wafer.

19. The method as recited in claim 14, wherein operations of the method are performed by a computer program when executed by one or more processors, the computer program being embedded in a non-transitory computer-readable storage medium.

20. The method as recited in claim 14, wherein setting the power level for the fourth RF power further includes:
setting the power level for the fourth RF power to 100 W resulting in a DC bias on the first top electrode of −150V.

* * * * *